United States Patent [19]

Berdan et al.

[11] 3,969,199

[45] July 13, 1976

[54] COATING ALUMINUM WITH A STRIPPABLE COPPER DEPOSIT

[75] Inventors: Betty L. Berdan; Betty M. Luce, both of Willowick, Ohio

[73] Assignee: Gould Inc., Rolling Meadows, Ill.

[22] Filed: July 7, 1975

[21] Appl. No.: 593,894

[52] U.S. Cl.................................. 204/33; 204/3; 204/12; 204/40
[51] Int. Cl.².................... C25D 5/44; C25D 1/00
[58] Field of Search .............. 204/3, 12, 13, 33, 29, 204/32 R, 40

[56] References Cited
UNITED STATES PATENTS

| | | | |
|---|---|---|---|
| 1,144,000 | 6/1915 | Roux | 204/33 |
| 2,662,831 | 12/1953 | Culverhouse | 204/33 X |
| 2,874,085 | 2/1959 | Brietzke | 204/12 X |
| 2,995,814 | 8/1961 | Chamness | 204/33 X |

FOREIGN PATENTS OR APPLICATIONS

| | | | |
|---|---|---|---|
| 938,236 | 10/1963 | United Kingdom | 204/13 |

Primary Examiner—G. L. Kaplan
Attorney, Agent, or Firm—Edward E. Sachs

[57] ABSTRACT

An improvement in providing a mechanically strippable copper plate on an aluminum carrier is achieved by pretreating the aluminum carrier with an alkaline, aqueous, alkali metal zincate composition containing a small amount of one or more water soluble iron, cobalt or nickel salts, and removing substantially all of the deposited zincate coating with acid prior to copper plating.

13 Claims, No Drawings

COATING ALUMINUM WITH A STRIPPABLE COPPER DEPOSIT

INTRODUCTION

The present invention relates to the art of electroplating, and more particularly, to the electrocathodic deposition of copper on a carrier formed of aluminum. For purposes of this disclosure, the term "aluminum" is intended to embrace the commercially pure metal, as well as alloys of the metal which are predominantly, or contain substantial amounts of aluminum.

The invention is particularly applicable to the formation of ultra-thin electrocathodically deposited foils of copper on an aluminum carrier, which foils may have a thickness on the order of 0.2 to 0.3 mils. Such ultra-thin foils of copper find utility in the manufacture of printed circuit boards.

The well known technique for manufacturing printed circuit boards from such ultra-thin foils of copper involves depositing the copper on a temporary carrier such as a thin sheet of aluminum, applying the exposed surface of the copper to a printed circuit board, such as an epoxy resin impregnated fiber glass mat, bonding the copper surface to the epoxy resin through the use of heat and pressure, and then removing the temporary carrier. This last step may be accomplished either by mechanical stripping or by chemical means. Mechanical stripping is preferred because it is less expensive and less time consuming, but it does require the strength of the bond between the copper and the aluminum temporary carrier, i.e., the peel strength, to be controlled so that stripping can be accomplished without rupturing the ultra-thin foil of copper.

For purposes of this disclosure, "peel strength" is a measurement of the force in pounds required to separate a one inch wide strip of the temporary carrier from the laminated copper foil when pulled at an angle of 90°. In general, it has been found that peel strengths not substantially in excess of 10 lbs/in and preferably within the range of about 6 to 8 lbs/in. will permit separation by mechanical stripping means. However, for commercial operations where peeling by hand without mechanical assist is considered essential, peel strengths should not exceed about 2 lbs/in. and are preferably within the range of about 0.2 to about 1 lb/in.

BACKGROUND OF THE INVENTION

The present technology for producing mechanically strippable thin copper foil on an aluminum carrier involves the following combination of steps:

Clean to remove oil from aluminum carrier
Water rinse
Etch to provide a uniform matte surface
Water rinse
Treat with acid to neutralize etchant and to desmut
Water rinse
Apply copper electroplate from standard pyrophosphate copper bath to build up a thickness of up to about 50 microinches.
Water rinse
Build up thickness of copper with any conventional copper electroplating bath.

While this procedure can and does produce very satisfactory mechanically strippable ultra-thin foils of copper on an aluminum carrier, it does have its limitations. For example, the initial stages of copper deposition produce a sparse distribution of relatively large copper nuclei. This in turn limits the rate at which a relatively non-porous copper layer providing full coverage is developed.

Attempts to increase the density of copper nuclei by adjusting the parameters of the existing process have not been fruitful.

The advantage of an increase in density of smaller copper nuclei is tha it results in an initial copper plate which is less porous than one developed from a relatively sparse distribution of nuclei. Further, a higher density of copper nuclei will result in more complete coverage with the application of a thinner layer of copper than attainable with present technologies. This has certain economic advantages.

Further, the ability to obtain good coverage and low porosity with less copper reduces the required contact time with the copper bath, which can result in an increased line speed in a continuous plating operation.

Some improvement in the direction of decreasing contact time has been accomplished by increasing the current density of the pyrophosphate copper plate cell. However, there is a limit to which current density can be increased before burning of the copper plate takes place.

The prior art has recognized that some improvement in adhesion and corrosion resistance in copper plating aluminum can be achieved by first treating the aluminum with an alkaline, aqueous, alkali metal zincate treating bath. Such zincate baths, as described in U.S. Pat. Nos. 2,676,916 and 2,650,886, contain an alkali metal hydroxide, zinc oxide, a water soluble metal salt, such as a salt of iron, cobalt or nickel, and a complexing agent for the metal ions introduced as the water soluble metal salt, such as Rochelle salt, a tannate, or a sugar. These prior art patents also teach that the thickness of the zincate coating may be controlled by the addition of minor amounts of a nitrate or nitrite.

Since these zincate treating baths are designed to improve the adhesion between the subsequently applied copper plate and an aluminum carrier, they would not be useful in the preparation of ultra-thin copper foils which are mechanically strippable from aluminum carriers.

It is also known in the art to anodize aluminum in the presence of ferric ions, and to anodize iron plated aluminum, prior to copper plating the aluminum. This procedure, according to Akiyama et al, "Electroplating on Anodized Aluminum" Plating Magazine, pp. 594–598, June, 1971, produces copper plates having "good" adhesion to aluminum.

SUMMARY OF THE INVENTION

We have found, in accordance with the present invention, that a densely nucleated copper coating, which is mechanically strippable from an aluminum carrier, can be achieved by pretreating the aluminum carrier with an alkaline, aqueous, alkali metal zincate solution containing a minor amount of water soluble salt selected from the group consisting of iron, cobalt and nickel salts, and then removing substantially the entire coating by treating it with an acid. The initial stages of copper electroplate, applied to an aluminum carrier pretreated in this manner, consists of a very high density of small copper nuclei. This is to be contrasted with the appearance of the initial stages of a copper electroplate deposited on an aluminum carrier not so pretreated, where the copper plate consists of a sparse distribution of relatively large copper nuclei.

The inclusion of the zincate treatment but omitting the water soluble iron, cobalt or nickel salt, produces a moderate increase in the density of copper nuclei, but a dramatic increase in the density of nuclei is achieved when the water soluble metal salt is present in the zincate treating bath.

As would be expected, the inclusion of the zincate treatment, but without the subsequent acid treatment to remove the zincate coating, the results in a copper plate which is firmly bonded to the aluminum substrate and not mechanically strippable therefrom. This result obtains whether the water soluble metal salt ingredient is present or absent.

The advantages from the practice of the present invention include the production of ultra-thin copper plates on aluminum which have a higher density and lower porosity than copper plates produced in accordance with the prior art method. Further, the method of the present invention permits the use of higher speeds in a continuous plating line since a greater number of small nuclei are produced in the same time that the prior art method produces the lesser number of sparsely arranged large nuclei. Thus, the practice of the present invention provides excellent initial coverage of copper on the aluminum in a relatively short period of time. By way of example, where a processing line following the teachings of the prior art was able to produce a satisfactory product at a linear speed for the aluminum carrier of 4 ft./min. shifting over to the method of the present invention, even without optimization, resulted in the ability to produce equivalent product at a line speed of 8 ft/min.

More specifically, in accordance with the present invention, there is provided a method of electroplating an aluminum carrier with a mechanically strippable copper electroplate, comprising the steps of providing the carrier with a coating by contacting it with an aqueous, alkaline solution of an alkali metal zincate containing at least about 0.25 and preferably from about 0.5 to about 3 g/l of a water soluble salt of a metal selected from the group consisting of iron, cobalt, nickel and mixtures thereof, and a complexing agent for the metal ions introduced as the water soluble salt, contacting the coated carrier with an acid to remove substantially all of the coating, and electroplating copper on the treated surface of the carrier.

It is therefore an object of the present invention to provide an improvement in electroplating aluminum with copper.

A further object of the invention is to provide a mechanically strippable copper electroplate on an aluminum carrier which is developed from an initial copper plate which has a high density of small copper nuclei.

Yet another object of the invention is to provide an improved method of copper plating aluminum which can proceed at higher line speeds than possible with prior art methods.

Other objects and advantages of the present invention will become apparent from the following detailed description thereof, which includes the best mode contemplated for practicing the invention.

DETAILED DESCRIPTION OF THE INVENTION

Zincate treating baths, useful in the practice of the present invention, are generally formed by admixing an alkaline metal hydroxide and zinc oxide in a ratio of about 10:1. Suitable alkali metal hydroxides include sodium hydroxide, potassium hydroxide, lithium hydroxide and rubidium hydroxide. Sodium hydroxide is, of course, preferred because of low cost and ready availability.

In general, fairly dilute zincate solutions are preferred since concentrations of alkali metal hydroxide of about 100 g/l produce pitting on the surface of the aluminum carrier. It is therefore preferred that the alkali metal hydroxide be present at a concentration within the range of about 45 to about 55 g/l. Observing the 10:1 ratio mentioned above, the corresponding zinc oxide concentration is preferably within the range of about 4.5 to about 5.5 g/l.

The water soluble metal salt of iron, nickel or cobalt may be present in an amount as low as 0.5 g/l and possibly lower, to produce the desired result. Higher concentrations can be used but may be difficult to justify economically. In general, concentrations in excess of 3 g/l should be avoided since there is some indication (see Example III below) that higher concentrations produce undesirable side effects. Suitable anions include chloride, sulfate, nitrate and nitrite. Mixtures of water soluble salts are also contemplated.

A complexing agent, operative in an alkaline pH of at least 12 is required to keep the water soluble metal salts in solution. Suitable complexing agents include Rochelle salt, sodium glyconate, tannates, glycerin, mannitol, and other sugars. The material should be employed in an amount sufficient to keep the water soluble metal salts in solution. Suitable concentrations may vary over wide limits depending on the pH of the bath, the efficiency of the complexing agent and other factors. Concentrations within the range of about 25 to 100 g/l generally produce satisfactory results.

The inclusion of nitrate or nitrite ions tends to reduce the thickness of the zincate coating deposited and to provide a smoother coating. Sodium, potassium and ammonium nitrate and nitrite are useful for this purpose. On the order of 1 g/l of nitrite or nitrate produces the desired effect. A separate nitrate or nitrite ingredient may be obviated if the water soluble metal salt incorporate one of these anions. Thus, for example, the use of 2 g/l of $Fe(NO_3)_3 \cdot 9H_2O$ will obviate the use of a separate nitrate or nitrite compound.

As might be expected, increasing the time of immersion increases the thickness of the zincate coating deposited. It has also been found that increasing the temperature of the bath increases the thickness of the zincate deposit during a fixed immersion interval. In general, it has been found that immersion times, within the range of about 15 to about 30 seconds, with zincate baths at temperatures within the range of about 25 to about 40°C, produce satisfactory results.

It is important in achieving a mechanically strippable ultra-thin copper foil that substantially all of the zincate coating be removed prior to copper plating. This can be accomplished by immersing the zincate coated aluminum carrier in a mineral acid, of which nitric acid, hydrochloric acid and sulfuric acid are preferred. Satisfactory results have been achieved with 25 vol. % nitric acid, 5 vol. % hydrochloric acid and 5 vol. % sulfuric acid.

A double immersion zincate technique is described in the prior art (see U.S. Pat. No. 2,650,886) as being useful in improving the bond between copper and aluminum. We have found unexpectedly that a double immersion — double removal technique actually decreases the number of copper nuclei developed as consequence of a single immersion — single removal technique. Accordingly, the duplication of steps is not recommended in the practice of the present invention.

Following the acid treatment, the aluminum carrier is plated with copper to a thickness of up to 50 microinches with a standard pyrophosphate copper plating bath. Thereafter, the copper plate is built up using any conventional copper plating system.

The copper foil produced in accordance with the preceding steps will generally have a peel strength within the range of from about 6 to about 1.5 lb./in. While peel strengths of this magnitude will usually permit the aluminum carrier to be mechanically stripped from the laminated copper foil, the values are too high to be considered acceptable for commercial application. To the end of reducing the peel strength to commercial processing levels of not in excess of about 2 lb./in., the copper plated aluminum carrier may be overplated with a metal selected from the group consisting of zinc and indium, as set forth in copending application Ser. No. 431,060 filed Jan. 7, 1974, and assigned to the assignee of the present application.

More specifically, as described in said copending application, a zinc overplate may be deposited from a zinc sulfate plating solution, and an indium overplate may be deposited from an indium fluoborate plating solution. Deposits on the order of 10–20 microinches will result in the desired reduction in peel strengths to levels not in excess of about 2 lb/in.

The following alkaline, aqueous, alkali metal zincate composition was used to establish the efficacy of the invention, and was modified as indicated in the examples below, to establish certain parameters of the present invention:

TABLE I

| Ingredients | Proportions (g/l) |
| --- | --- |
| Sodium hydroxide | 50 |
| Zinc oxide | 5 |
| Rochelle salt | 50 |
| Ferric chloride | 2 |
| Sodium nitrate | 1 |

In each of the following examples, except where otherwise indicated, experiments were performed using as the carrier sheets of Aluminum 1100, a commercial grade aluminum, which is believed to have the following composition:

| Ingredients | Proportions (wt. %) |
| --- | --- |
| Silicon plus iron | 1.0 max. |
| Copper | .20 max. |
| Manganese | .05 max. |
| Zinc | .10 max. |
| Other elements, total | .015 max. |
| Aluminum | 99.00 min. |

Pretreatment of the aluminum carrier involved immersion in a two percent hydroxide etchant for 87 seconds at room temperature, rinsing in tap water for 87 seconds, treating with 25 vol. % nitric acid at room temperature for 87 seconds, and again rinsing in tap water for 87 seconds.

The aluminum carrier was then immersed in the zincate bath at room temperature for 17 seconds. Thereafter, the zincate treated aluminum carrier was rinsed with tap water for 87 seconds, immersed in 25 vol. % nitric acid at room temperature for 87 seconds to remove substantially all of the zincate coating, and then provided with a 50 microinch copper electroplate from a standard pyrophosphate copper bath operated at a current density of 50 amps/ft.$^2$ for 2 minutes at a pH within the range of from about 8 to about 8.5, and a bath temperature of about 60°C.

Examination of Scanning Electron Microscope (SEM) photographs of the early development of the copper plate revealed the presence of a dense distribution of small copper nuclei. This observation was in contrast to the sparse distribution of relatively large copper nuclei encountered in practicing conventional preplating techniques.

The copper plated aluminum carrier was further electroplated using an electrolyte having a composition falling within the following ranges:
 20–40 g/l copper as copper sulfate pentahydrate
 50–60 g/l sulfuric acid
 10–22 nitrate as ammonium nitrate The cell was operated at a current density of 100 amps/ft$^2$ with a contact time of two minutes, and a bath temperature within the range of 24°–28°C. During this period of time, an electroplate of about 0.2 mil thickness was developed.

The copper plated aluminum carrier was rinsed with tap water for 87 seconds and dried.

Where overplating was employed to reduce peel strength, a plate of zinc measuring from about 10 to 20 microinches in thickness was deposited from a plating solution comprising:
 310 g/l zinc sulfate
 27 g/l aluminum sulfate
 22 g/l sodium sulfate The plating was conducted at a current density of 25 amps/ft$^2$ with the plating bath at room temperature.

EXAMPLE I

The ability to practice the invention with water soluble metal salts other than ferric chloride was established by a series of runs in which other soluble metal salts were employed in concentrations providing equivalent amounts of metal ions. The materials employed were nickel sulfate, a 50/50 mixture of iron chloride and nickel sulfate, cobalt chloride and cobalt sulfate. Visual inspection of the deposits from the various zincate compositions showed that nickel and cobalt zincates closely resembled the iron zincate deposits. SEM photographs of the residue of the zincate coating following the nitric acid treatment and copper deposits of 3 and 6.5 microinches showed that the nickel resembled the iron, but that the cobalt provided even more dense nucleation than either iron or nickel. It was also found that a combination of iron and nickel provided somewhat more dense nucleation than either metal when used alone.

The following peel strengths were developed:

TABLE II

| Water Soluble Metal Salt | Peel Strengths (lb/in) | |
| --- | --- | --- |
| | Zincate | Zincate & Zn Overplate |
| Ferric chloride | 8.8 – 9.0 | <0.5 |
| Nickel sulfate | 10.4 – 10.8 | 0.6 – 0.7 |
| 50/50 mixture of ferric chloride and nickel sulfate | 8.0 – 8.2 | <0.5 |
| Cobalt sulfate | 7.0 – 7.2 | 0.3 – 0.32 |
| Cobalt chloride | 6.0 – 6.2 | 1.0 – 1.2 |

EXAMPLE II

A series of SEM photographs each depicting at 1000X magnification, a 6.5 microinch deposited copper following various pretreatments was analyzed by Quantimet 720. This device quantified the density of nuclei in terms of the average percent area of aluminum carrier covered by copper nuclei, and the size of the nuclei in terms of the average area covered by the nuclei.

The percent coverage data were developed by averaging the results obtained from the examination of between 17 and 23 different surface areas.

The data on the area of the nuclei were developed by averaging the results obtained from the measurement of between 180 and 217 nuclei.

The results are tabulated below:

TABLE III

| Pretreatment | Avg % Coverage | Avg. Area of Nucleus (mm) |
|---|---|---|
| No zincate | 32.6 | $26.6 \times 10^{-4}$ |
| Zincate – no Fe | 46.5 | $5.6 \times 10^{-4}$ |
| Zincate + Fe | 99.9 | $2.0 \times 10^{-4}$ |
| Zincate & Fe & Ni | 99.9 | — |
| Zincate & Ni | 87.1 | $2.0 \times 10^{-4}$ |

These data show the zincate pretreatment without the inclusion of iron or equivalent, provides a modest increase in density of copper nuclei coupled with a substantial decrease in nucleus size, while the zincate plus iron (or equivalent) pretreatment provides a dramatic increase in the density of copper nuclei with a substantial decrease in nucleus size.

EXAMPLE III

A series of experiments were run to determine the effect of varying the concentration of water soluble metal salt present in the zincate treating composition. To this end, a series of aluminum specimens were prepared using zincate treating baths in which the quantity of ferric chloride present was varied to be 0, 0.5, 1, 2, 3 and 4 g/l. In addition, a run was made omitting the zincate treating step.

Examination of SEM photographs showed that the copper coating on specimens not exposed to the zincate treating showed sparse, isolated, fairly large copper nuclei after deposition of a 6.5 microinch copper plate. Specimens treated with the zincate bath from which the ferric chloride had been omitted showed some increase in the number of copper nuclei. The addition of as little as 0.5 g/l of ferric chloride produced a very pronounced increase in the number of very small nuclei. Little change in appearance was found in copper nucleation as the concentration of ferric chloride was increased to 3 g/l. However, at 4 g/l of ferric chloride, an uneven dark zincate deposit was noticed, which left a mottled appearance on the aluminum carrier following treatment with nitric acid.

Peel strength tests showed that there was no significant change in peel strength as the quantity of ferric chloride was increased from 0.5 to 3 g/l, and that a significant increase in peel strength developed at 4 g/l of ferric chloride:

TABLE IV

| Ferric chloride in zincate (g/l) | Peel Strengths (lb/in) Zincate | Zincate & Zn Overplate |
|---|---|---|
| 0.5 | 10.2 – 10.4 | <0.5 |
| 1.0 | 10.2 – 10.4 | <0.5 |
| 2.0 | 10.2 – 10.4 | <0.5 |
| 3.0 | 9.8 – 10.2 | <0.5 |
| 4.0 | 13.5 – 14 | — |

EXAMPLE IV

Potassium, lithium and rubidium hydroxides were substituted for sodium hydroxide in the zincate composition. Visual inspection of the zincated and copper plated specimens appeared to be essentially the same. The peel strengths developed are reported below.

TABLE V

| Hydroxide addition to zincate | Peel Strengths (lb/in) Zincate | Zincate & Zn Overplate |
|---|---|---|
| Sodium hydroxide | 8.8 – 9.0 | <0.5 |
| Potassium hydroxide | 8.0 – 8.2 | <0.5 |
| Lithium hydroxide | 6.0 | 0.6/0.8 |
| Rubidium hydroxide | 4.2 – 4.4 | — |

EXAMPLE V

The effect of temperature of the zincate solution on the method of the invention was determined by a series of experiments in which the zincate solution was maintained at a temperature of 25°C, 40°C and 50°C. Visual examination of the samples showed that the zincate deposits were darker and less uniform as the temperature of the zincate bath increased. Further, at 50°C, light gassing was noted, and the aluminum had a frosty appearance following the nitric acid treatment. The peel strength increased slightly as the zincate bath temperature increased from 25° to 40°C, but it was found that actual bonding between the copper and aluminum occurred where the zincate treatment was conducted at 50°C.

TABLE IV

| Temperature of Zincate in Bath | Peel Strength (lbs/in.) |
|---|---|
| 25°C | 8.8 – 9.0 |
| 40°C | 10.0 – 10.2 |
| 50°C | Cu bonds to Al |

The increase in peel strength with temperature may be due to mechanical anchoring of the copper to the aluminum as a result of surface attack of the treating solution on the aluminum, or to the presence of zincate coating, which is deposited in increased thicknesses at elevated temperatures and may not be completely removed.

EXAMPLE VI

The effect of time on the zinc immersion step was determined by a series of runs in which the immersion time was varied at 8, 17, 30 and 60 seconds. In these runs, the temperature on the zincate bath, all of the rinse baths, the caustic etch bath and the nitric acid baths, were operated at 25°C. Under these conditions, a zincate treatment of 8 seconds produced a very light gray film, and initial copper deposits showed poor coverage. At 17 seconds, a uniform gray film was observed as was high density copper nucleation during the initial deposit stages. At 30 seconds, the zincate film was darker and less uniform and the aluminum carrier appeared to be stained following the nitric acid treatment. Specimens immersed in the zincate bath for 60 seconds produced an even darker zincate coating and a more pronounced stained deposit following the nitric acid treatment.

The results of peel strength tests are indicated in the table below:

TABLE IV

| Time in Zincate Bath (sec.) | Peel Strength (lbs./in.) |
|---|---|
| 8 | Coverage too poor to laminate |
| 17 | 8.8 – 9.0 |
| 30 | 11.8 – 12.0 |
| 60 | Cu bonds to Al |

From these data, it was evident that a minimum zincate contact time in excess of 8 seconds is required to produce the desired results, and that a zincate contact time of 30 seconds and above produces peel strengths which exceed the upper limit for mechanical removal. It is to be expected that the maximum upper time limit can be increased beyond 30 seconds, if the subsequent nitric acid treatment time is correspondingly increased to provide adequate time for removal of the heavier zincate coating deposited on the aluminum carrier.

Having thus described our invention, we claim:

1. A method of electroplating an aluminum carrier with a mechanically strippable copper electroplate, which method comprises providing said carrier with a coating by contacting said carrier with an aqueous, alkaline solution of alkali metal zincate containing at least about 0.25 g/l of a water soluble salt of a metal selected from the group consisting of iron, cobalt, nickel and mixtures thereof, and a complexing agent for the metal ions introduced as said water soluble salt,
   contacting said coated carrier with an acid to remove substantially all of said coating, and
   electroplating copper on the treated surfaces of said carrier.

2. The method defined in claim 1 wherein the said zincate solution further comprises a material selected from the group consisting of sodium nitrate, potassium nitrate, ammonium nitrate, sodium nitrate, potassium nitrite and ammonium nitrite.

3. The method defined in claim 2 wherein said water soluble salt is ferric chloride.

4. The method defined in claim 3 wherein said acid is nitric acid.

5. The method defined in claim 1 wherein said water soluble salt is ferric nitrate.

6. The method defined in claim 1 wherein said complexing agent is selected from the group consisting of Rochelle salt, sodium gluconate and mannitol.

7. The method defined in claim 1 wherein said copper electroplate is deposited from a pyrophosphate copper plating bath.

8. The method defined in claim 1 wherein the copper electroplate is provided with an overplate of a metal selected from the group consisting of zinc and indium to reduce the peel strength between the copper electroplate and the aluminum carrier.

9. A method of providing a temporary aluminum carrier with a densely nucleated copper coating, said method comprising:
   contacting said carrier with an aqueous composition prepared from the following ingredients:
      from about 45 to about 100 g/l of an alkali metal hydroxide; from about 4.5 to about 10 g/l of zinc oxide; from about 0.5 to about 3.0 g/l of a water soluble salt of a metal selected from the group consisting of iron, cobalt, nickel and mixtures thereof; and from about 25 to about 100 g/l of a complexing agent for metal ions introduced as said water soluble salt, thereby to form on said carrier a zincate coating;
   contacting said carrier with an acid to remove substantially all of the said coating, and
   electroplating said treated surface with copper to produce a densely nucleated copper coating on said carrier.

10. The method defined in claim 9 wherein said composition comprises:

| | |
|---|---|
| Sodium hydroxide | 50 g/l |
| Zinc Oxide | 5 g/l |
| Ferric chloride | 2 g/l |
| Rochelle salt | 50 g/l |
| Sodium nitrate | 1 g/l. |

11. The method defined in claim 10 wherein said acid is 25 vol. % nitric acid.

12. The method defined in claim 9 wherein the electroplating step is accomplished with a pyrophosphate copper bath.

13. The method defined in claim 9 wherein the copper electroplate is overplated with a metal selected from the group consisting of zinc and indium to reduce the peel strength between the copper and the aluminum carrier.

* * * * *

UNITED STATES PATENT AND TRADEMARK OFFICE
CERTIFICATE OF CORRECTION

PATENT NO. : 3,969,199
DATED : July 13, 1976
INVENTOR(S) : Betty L. Berdan et al It is certified that error appears in the above-identified patent and that said Letters Patent are hereby corrected as shown below:

Column 3, line 16, between "advantages" and "from", please insert the word --derived--.

Column 9, line 49, "sodium nitrate" should be --sodium nitrite--

*Signed and Sealed this*

*Twenty-seventh* Day of *September 1977*

[SEAL]

*Attest:*

RUTH C. MASON
*Attesting Officer*

LUTRELLE F. PARKER
*Acting Commissioner of Patents and Trademarks*